US007379728B2

(12) United States Patent
Takikawa et al.

(10) Patent No.: US 7,379,728 B2
(45) Date of Patent: May 27, 2008

(54) WIRELESS COMMUNICATION SYSTEM

(75) Inventors: Kumiko Takikawa, Tama (JP); Satoshi Tanaka, Kokubunji (JP); Yoshiyasu Tashiro, Takasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/703,803

(22) Filed: Feb. 8, 2007

(65) Prior Publication Data

US 2007/0135072 A1    Jun. 14, 2007

Related U.S. Application Data

(63) Continuation of application No. 11/325,528, filed on Jan. 5, 2006, now Pat. No. 7,274,923, which is a continuation of application No. 09/785,500, filed on Feb. 20, 2001, now Pat. No. 7,013,123.

(30) Foreign Application Priority Data

Feb. 21, 2000    (JP)    ............................. 2000-043063

(51) Int. Cl.
*H04B 1/28* (2006.01)
*H04B 1/06* (2006.01)
(52) U.S. Cl. ...................... 455/333; 455/334; 455/230; 455/232.1; 455/78; 455/260; 246/44
(58) Field of Classification Search ................ 455/333, 455/230, 232.1, 334, 552.1, 260, 78, 73; 246/44; 370/345, 343, 338
See application file for complete search history.

(56) References Cited

U.S. PATENT DOCUMENTS 6,298,246 B1    10/2001    Lysejko et al.
6,308,047 B1    10/2001    Yamamoto et al.

(Continued)

FOREIGN PATENT DOCUMENTS

JP           57-43453         3/1982

(Continued)

OTHER PUBLICATIONS

Digest of Technical Papers ISSC98/Feb. 5, 1998, pp. 48-49, 411, "A Single-Chip CMOS Transceiver for DSC1800 Wireless Communications".

(Continued)

*Primary Examiner*—Matthew Anderson
*Assistant Examiner*—Eugene Yun
(74) *Attorney, Agent, or Firm*—Mattingly, Stanger, Malur & Brundidge, PC

(57) ABSTRACT

A wireless communication system includes: a filter; and a semiconductor chip including a signal processing integrated circuit having an amplifier, wherein a main surface of the semiconductor chip is provided with a plurality of electrode terminals along an edge portion thereof; wherein the amplifier has a transistor including a control electrode, a first electrode through which a signal is outputted, and a second electrode to which a voltage is applied; wherein the control electrode, the first electrode and the second electrode of the transistor are connected to the electrode terminals, respectively; and wherein none of wirings are arranged between the electrode terminals and placements of the control electrode, the first electrode and the second electrode, making space between the electrodes and the electrode terminals narrow.

4 Claims, 9 Drawing Sheets

U.S. PATENT DOCUMENTS 6,510,309 B1   1/2003   Thompson et al.

FOREIGN PATENT DOCUMENTS

| JP | 59-181560 | 10/1984 |
| JP | 02-142185 | 5/1990 |
| JP | 2000-299438 | 10/2000 |
| WO | 00/03490 | 1/2000 |

OTHER PUBLICATIONS

Digest of Technical Papers ISSC99/Feb. 16, 1999, pp. 224-225, 463 "Dual Band High-Linearity Variable-Gain Low-Noise Amplifiers for Wireless Applications".

Hitachi Review, vol. 81, No. 10, Oct. 1999, pp. 17-20.

WIRELESS COMMUNICATION SYSTEM

This is a continuation application of U.S. application Ser. No. 11/325,528, filed Jan. 5, 2006 now U.S. Pat. No. 7,274,923, which is a continuation application of U.S. application Ser. No. 09/785,500, filed Feb. 20, 2001, now U.S. Pat. No. 7,013,123.

BACKGROUND OF THE INVENTION

1. Field of the Invention

The present invention relates, in general, to a wireless communication system. More particularly, the invention relates to the technology which is effectively employed to the layout technique of internal circuits of a reception integrated circuit for the wireless communication in which the high frequency characteristics become excellent.

2. Description of the Related Art

In a signal processing integrated circuit (IC) in a wireless communication system (an terminal apparatus of a wireless communication mobile body; it will hereinafter also be. referred to as "a terminal apparatus" for short, when applicable) such as a digital cellular system, a large number of internal circuits are incorporated in a single semiconductor chip.

The signal processing IC for example, is described in an article of "DIGEST OF TECHNICAL PAPERS", ISSC98/Feb. 5, 1998, pp. 48 to 49, pp. 441 "A SINGLE-CHIP CMOS TRANSCEIVER FOR DCS1800 WIRELESS COMMUNICATIONS". In this article, there is disclosed an IC in which a DCS (Digital Cellular System) 1800 oriented transmitting and receiving circuit is formed in one chip. In accordance with the layout photograph, a power source line or a ground line is present in the inside of the line of electrode terminals (pads), and LNA (Low-Noise Amplifier) circuits are arranged in the inside of the power source line or the ground line, and a power source line or a ground line is arranged in the inside of the LNA circuits.

In addition, the similar technique is described in an article of "DIGEST OF TECHNICAL PAPER", ISSC99/Feb. 16, 1999, pp. 224 to 225, pp. 463 "DUAL-BAND HIGH-LINEARITY VARIABLE-GAIN LOW-NOISE AMPLIFIERS FOR WIRELESS APPLICATIONS". In this article, there is disclosed an IC wherein two low-noise amplifiers, which are oriented to a 0.9, 2.0 GHz oriented dual band wireless communication transmitting/receiving IC, are formed in. the one chip, and electrostatic discharge protection circuits are additionally provided therein, and also these constituent elements are all encapsulated in a TSSOP (Thin Small Outline Package) 20 pins-package. In accordance with the layout photograph, there exists a power source line and a ground line at the periphery of the circuitry, pads arranged at the inside of the periphery, the power source line and the ground line layed out inside the pads and the LNA circuit arranged inside the power source and the ground lines.

Further, as for other related application, there is a U.S. patent application Ser. No. 09/547,915 filed on Apr. 11, 2000 entitled "SEMICONDUCTOR INTEGRATED CIRCUIT" by Takikawa et al., the disclosure of which is incorporated herein by reference.

In addition, in an article of "HITACHI REVIEW", Vol 81, No. 10 (October, 1999), pp. 17 to 20, there is described a signal processing IC in which the transmitting and receiving units including an LNA and a dual synthesizer are formed in one chip. In this article, there is described an IC for a dual band mobile telephone capable of carrying out a GSM (Global System for Mobile Communications) and the signal processing for a DCS 1800. In the GSM, the signal received through an antenna is filtered by a band-pass filter which eliminates the unnecessary signal components to extract a signal of 925 to 960 MHz. Then, the signal is amplified by the dedicated LNA circuit. Also, in the DCS 1800, the signal received through an antenna is filtered by a band-pass filter which eliminates the unnecessary signal components to extract a signal of 1805 to 1880 MHz. Thereafter, the signal is amplified by the dedicated LNA circuit.

In the wireless communication system, since the low-noise amplifier (hereinafter, referred to as "the LNA" for short, when applicable) amplifies a received signal having a very small amplitude by a circuit in a first stage of the receiving system to send the amplified signal to a mixer as a next stage, the LNA controls greatly the whole characteristics of the receiving system. Therefore, the high frequency characteristics such as the high gain and the low noise are required for the LNA. As to the factors of degrading these characteristics, the following two points are considered.

(1) The negative feedback amount is increased and the gain is reduced due to the parasitic inductance of the wire connected to the emitter pad of a transistor constituting the LNA, and the leads extending over the inside and the outside of the package.

(2) If the wiring distance from the above-mentioned pad up to a base of the transistor constituting the LNA circuit is long, then the wiring capacitance is increased, the gain is reduced, and also the noise characteristic is degraded due to the increase of the wiring resistance.

On the other hand, in the conventional signal processing IC, there are the following problems.

(a) In the case of the conventional signal processing IC having a power source line and a ground line arranged between the edge portion of the semiconductor chip and pads to be connected with wirings, the wirings for connecting the pads and the inner ends of leads become longer by the length over the power source and ground lines, so that the gain is reduced and the noise characteristic is degraded.

(b) In also the case of the conventional signal processing IC in which the power source line or the ground line is arranged between the LNA circuit and the pads, similarly to the foregoing, the length of the wiring is increased more, the gain is reduced and the noise characteristic is degraded with the power source line and the ground line arranged.

SUMMARY OF THE INVENTION

It is therefore an object of the present invention to provide a wireless communication system capable of enhancing the gain and noise characteristic at the high frequency band.

Simply describing the outline of typical aspects of the present invention disclosed in the present specification, the configuration thereof is as follows.

(1) A dual band wireless communication system having: a filter connected to an antenna; and a signal processing IC chip in which a transmitting and receiving circuit including an amplifier (a low-noise amplifier) connected to the filter is incorporated, and also having that; a plurality of electrode terminals are provided in a main surface of the IC chip along an edge of the main surface; the amplifier has a transistor constituted by a control electrode to which an output signal from the filter is supplied, a first electrode through which a signal is outputted in accordance with the signal supplied to the control electrode, and a second electrode to which a voltage (a ground voltage) is applied; and the control electrode, the first and second electrodes are connected to the electrode terminals through the wirings, respectively wherein none of wirings are arranged between the electrode terminals and placements of the control electrode, the first electrode and the second electrode.

In addition, no wiring is arranged between the electrode terminals and the side of mounting the semiconductor chip.

Also, the amplifier is present on one edge portion of the semiconductor chip and is arranged in the vicinity of the center thereof.

The wirings extended from the electrode terminals are connected to the control electrode of the transistor and one electrodes of electrostatic discharge protecting diodes which are provided for the transistor. This is also applicable to the first electrode and the second electrode.

In accordance with the above-mentioned measure (1), (a) since any of the wirings other than those of the transistor is not arranged between the electrode terminals and the electrodes (the control electrode, and the first and second electrodes) of the transistor, the distances between the electrodes and the electrode terminals are each shortened, the wiring capacitance becomes small, the gain is increased and the wiring resistance is reduced, which results in the excellent noise characteristic.

(b) Since no wiring is arranged between the side of the semiconductor chip and the electrode terminals, each of the lengths of the wires through which the electrode terminals and the inner ends of the leads are connected to one another is shortened, and the parasitic inductance due to the distribution of the wires is reduced, which results in the noise characteristics being excellent and enhancement of the gain.

(c) The amplifier is present on the edge portion of the semiconductor chip and is arranged in the vicinity of the center of the one edge portion. In the package structure employing the leads, each of the lengths of the leads arranged in the vicinity of the center of the above-mentioned one edge portion is also short. As a result, the distances from the electrodes to the outer ends of the leads projecting to the outside of the package become short, hence, it is possible to realize the enhancement of the gain and the noise characteristic.

(d) Since the wirings extending from the electrode terminals are connected to the control electrode and one electrodes of the protection diodes provided for the above-mentioned transistor, such configuration makes the design layout of the respective parts of the circuit to be readily carried out.

(e) In the wireless communication system, since the low-noise amplifier amplifies the received signal having a very small magnitude by the circuit in the first stage of the receiving system to send the amplified signal to the mixer in the next stage, the low-noise amplifier controls greatly the characteristic of the whole receiving system. Therefore, as described above, the low-noise amplifier becomes high gain and low noise, so, it is possible to enhance the characteristic of the whole receiving system of the wireless communication system.

(f) Since from the item (e), the gain and the noise characteristic of the low-noise amplifier are both excellent, the specification of the circuit in the stages after the mixer can be made less severe, and hence the circuit design can be readily carried out.

BRIEF DESCRIPTION OF THE DRAWINGS

The above and other objects as well as advantages of the present invention will become clear by the following description of the preferred embodiments of the present invention with reference to the accompanying drawings, wherein.

DETAILED DESCRIPTION OF THE EMBODIMENTS

Figure 1:
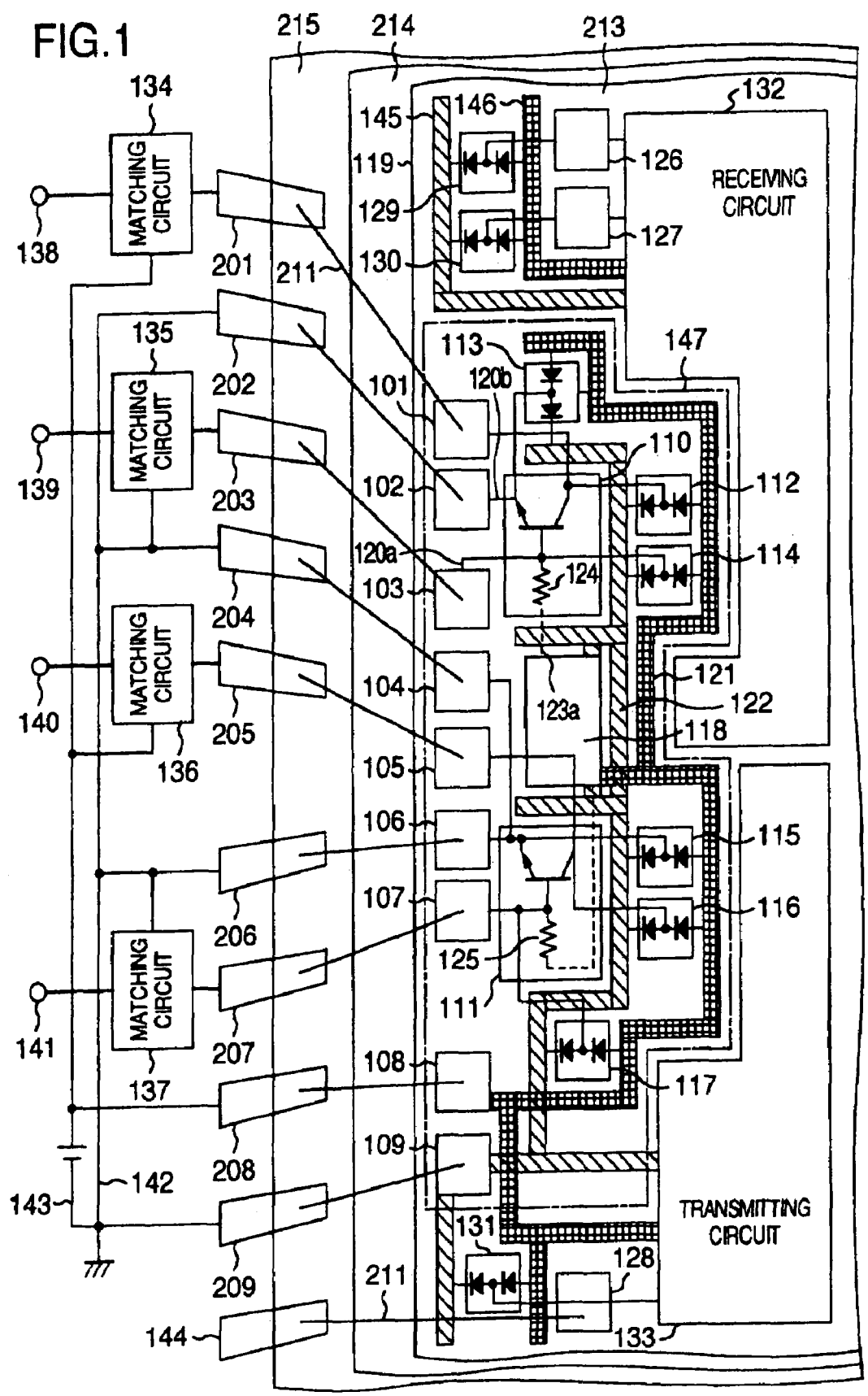
FIG. 1 is a schematic layout diagram showing a layout of low-noise amplifiers incorporated in a semiconductor integrated circuit device for use in a dual band wireless communication system in accordance with a first embodiment of the present invention.

The embodiments of the present invention will hereinafter be described in detail with reference to the accompanying drawings. In this connection, in all of the drawings for use in the description of the embodiments of the present invention, the constituent elements having the same function are designated with the same reference numerals, and the repeated description thereof is omitted here for the sake of simplicity.

First Embodiment

FIGS. 1 to 7 are figures each of which relates to a wireless communication system according to a first embodiment of the present invention. In the first embodiment, an example in which the present invention is applied to a wireless communication system of a TDMA (Time Division Multiple Access) system, e.g., a terminal apparatus of a wireless communication mobile body will hereinbelow be described in detail.

Now, a configuration of a TDMA dual band wireless communication terminal apparatus will hereinbelow be described with reference to FIG. 2. This terminal apparatus can execute the signal processing for a GSM system of a 900 MHz band and a DCS 1800 system of a 1800 MHz band.

Figure 2:
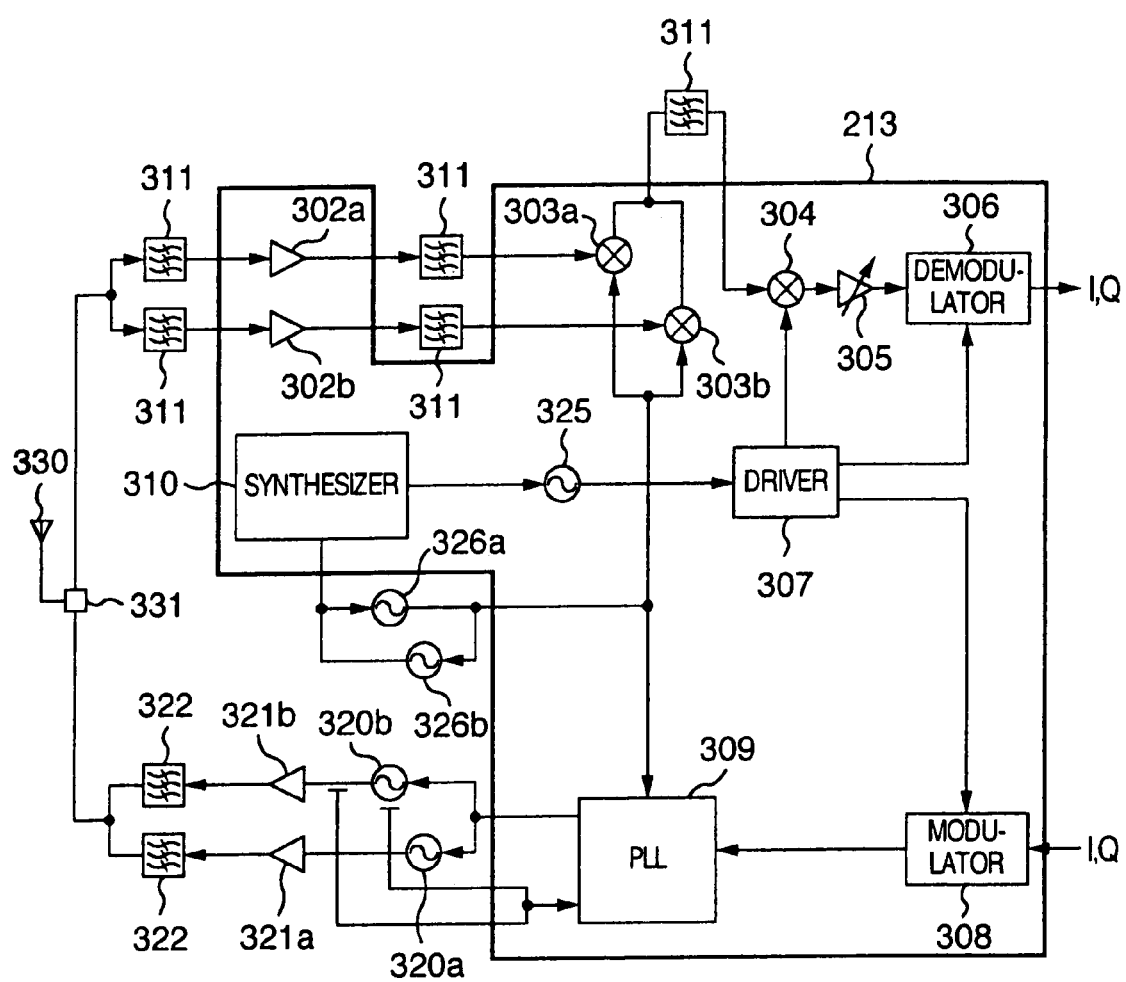
FIG. 2 is a block diagram, partly in circuit diagram, showing a functional configuration of the wireless communication system of the first embodiment of the present invention.

In a block diagram shown in FIG. 2, a transmitting and receiving circuit electrically connected to an antenna 330 through a transmitting and receiving switching unit 331 are both shown and each of them is connected to a base band signal processing circuit (not shown).

The receiving circuit includes: the antenna 330; the transmitting and receiving switching unit 331; two band-pass filters 311 connected in parallel with the transmitting and receiving switching unit 331; a LNA (low-noise amplifier) 302a for the high frequency band and a LNA 302b for the low-frequency band both connected to the band-pass filters 311, respectively; two band-pass filter 311 connected to the LNA 302a for the high frequency band and the LNA 302b for the low frequency band, respectively; a high frequency band receiving mixer 303a and a low frequency band receiving mixer 303b connected to the two band-pass filters 311, respectively; a band-pass filter 311 connected to the high frequency band receiving mixer 303a and the low frequency band receiving mixer 303b, respectively; a mixer 304 in the next stage connected to the band-pass filter 311; a variable gain amplifier 305 connected to the mixer 304 in the next stage; and a demodulator 306 connected to the variable gain amplifier 305. Then, the receiving circuit inputs I and Q signals outputted from the demodulator 306 to the base band signal processing circuit. Each of the above-mentioned band-pass filters 311 eliminates the out-of-band spurious.

The transmitting circuit includes: a modulator 308 for receiving, as an input signal thereof, the I and Q signals which are outputted from the base band signal processing circuit; an offset PLL (Phase-Locked Loop) 309; two VCOs (Voltage-Controlled Oscillator) 320a and 320b connected in parallel with the offset PLL 309; high frequency power amplification modules 321a and 321b connected to the VCOs 320a and 320b, respectively; two LPFs (Low-Pass Filter) 322 connected to the high frequency power amplifier modules 321a and 321b, respectively; the transmitting and receiving switching unit 331 to which the two LPFs 322 are connected; and the antenna 330.

The signal processing IC is provided with a synthesizer 310. This synthesizer 310 is connected to an IF (Intermediate) VCO 325 and carries out the control in such a way that the IFVCO 325 outputs an IF local signal. A divider 307 is connected to the VCO 325 to supply the local signal of the lower frequency to each of the mixer 304 in the next stage, the demodulator 306 and the modulator 308.

In addition, the synthesizer 310 is connected to the high frequency band receiving mixer 303a, the low frequency band receiving mixer 303a and the offset PLL 309 through the two RFVCOs 326a and 326b which are connected in parallel with each other to supply a local signal to each of the high frequency band receiving mixer 303a, the low frequency band reception mixer 303b and the offset PLL 309.

The transmitting and receiving IC 213 is constructed in such a way that the high frequency circuit of the dual band and the circuit of the intermediate frequency band are combined with each other to be self-contained in the form of one chip. The transmitting and receiving IC 213 is constituted by the circuits which are surrounded by a heavy line in FIG. 2. That is, the LNA 302a for the high frequency band; the LNA 302b for the low frequency band; the high frequency band receiving mixer 303a; the low frequency band receiving mixer 303b; the mixer 304 in the next stage; the variable gain amplifier 305; the demodulator 306; the divider 307; the modulator 308; the offset PLL 309; the synthesizer 310; and the IFVCO 325 are monolithically incorporated in the IC chip 231.

The signal (the electric wave) received through the antenna 330 is successively processed in the constituent elements of the receiving circuit to be sent to the base band signal processing circuit. In addition, the signal sent from the base band signal processing circuit is successively processed in the constituent elements of the transmitting circuit to be radiated in the form of the electric wave through the antenna 330.

Figure 5:
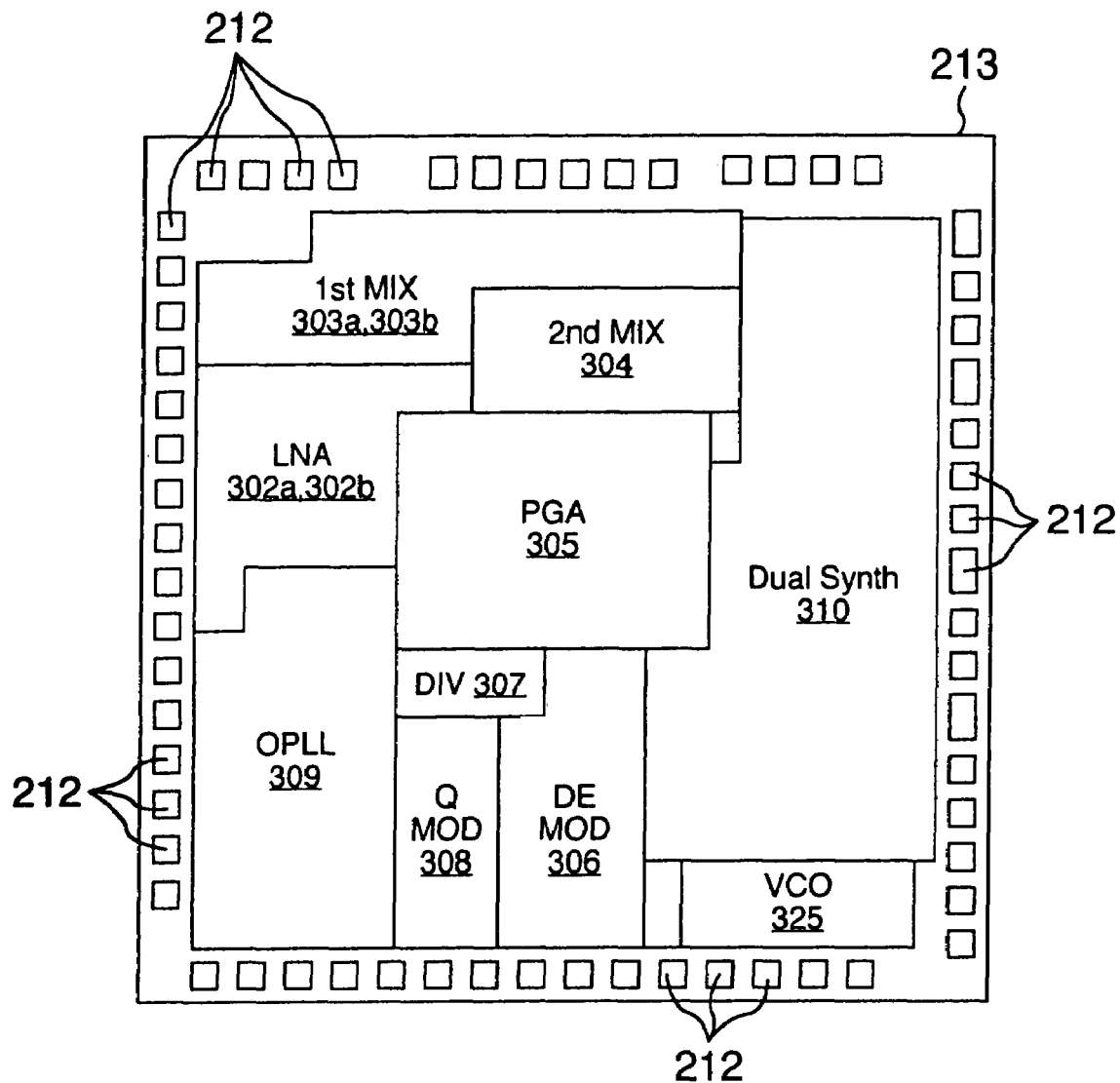
FIG. 5 is a schematic view of the layout showing the arrangement of circuits in an IC chip which incorporates the semiconductor integrated circuit device shown in FIG. 3.

FIG. 5 is a schematic view of the layout corresponding to the circuit diagram shown in FIG. 2 and showing the arrangement of the circuits provided in the IC chip 213. A plurality of electrode terminals (pads) 212 are arranged along the edge portion on the main surface of the IC chip 213. In this connection, the pads 212 are the generic term of the pads 101 to 109 and 126 to 128 shown in FIG. 1. Then, the circuits are arranged in the respective areas defined on the main surface of the IC chip 213 in the inside of the arrangement of the pads 212. As shown in FIG. 5, a PGA (Programmable Gain Amplifier) 305 is arranged at the center of the IC chip (the semiconductor chip) 213, a MIX 304 is arranged in the upper part of the figure, and a DIV 307, a QMOD 308, and a DEMOD 306 are all arranged in the lower part of the figure. In addition, 1st MIXs 303a and 303b, LANs 302a and 302b, and an OPLL 309 are arranged from the upper part to the lower part of the figure on the left side of those constituent elements, while a Dual Synth 310 and a VCO 325 are arranged from the upper part to the lower part of the figure on the right side thereof. In this connection, those circuit elements correspond to the circuits shown in FIG. 2 and the description thereof will hereinbelow be given in detail.

The high frequency band receiving mixer 303a and the low frequency band receiving mixer 303b are both provided in the 1st MIX part, and the mixer 304 in the next stage is provided in the 2nd MIX part.

Figure 3:
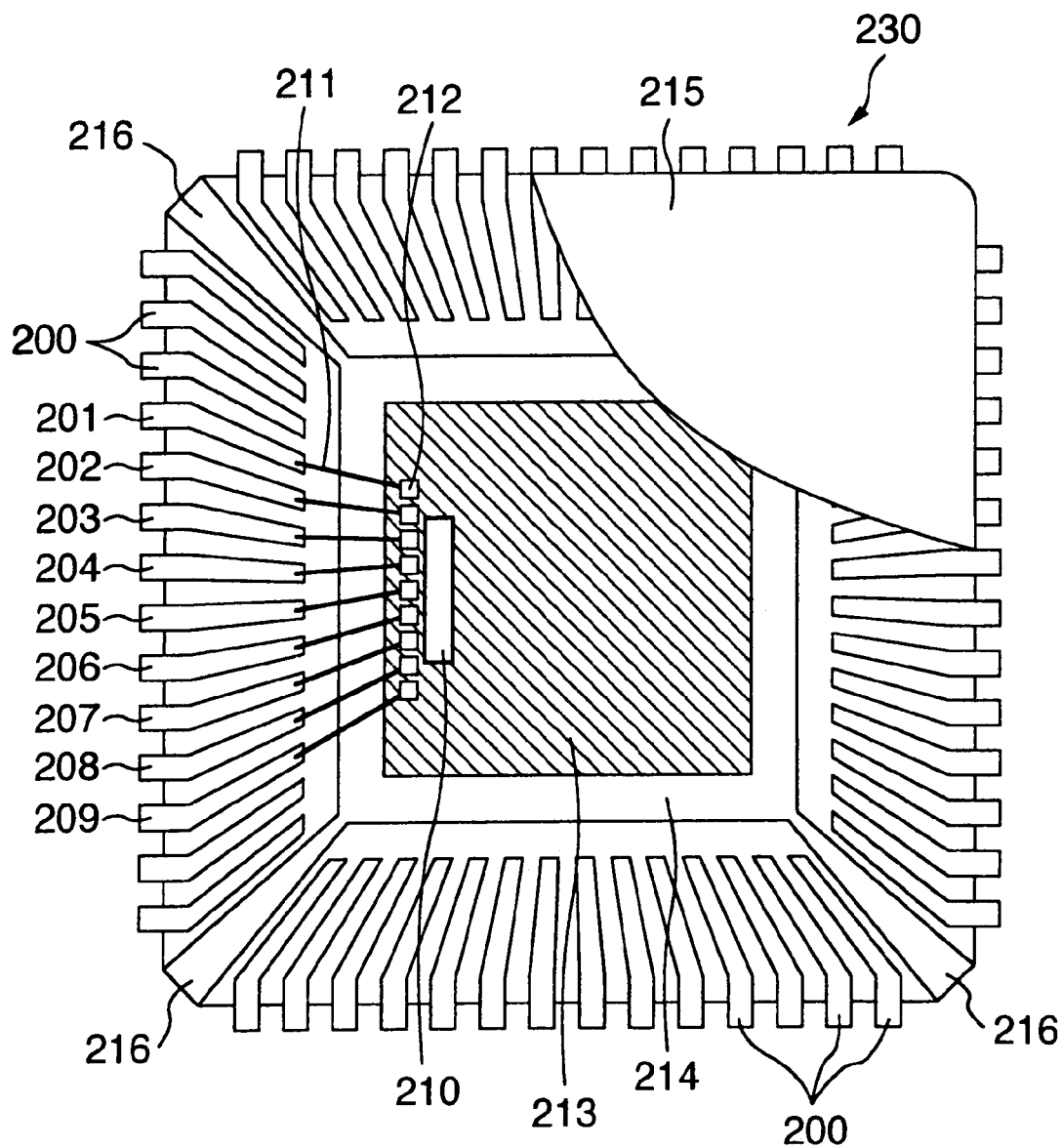
FIG. 3 is a schematic plan view showing the layout within a package of the integrated circuit incorporating the semiconductor integrated circuit of the first embodiment.

The LNA 302a for the high frequency band and the LNA 302b for the low frequency band are both provided in the LNA part. The LNA 302a for the high frequency band and the LNA 302b for the low frequency band are both close to the arrangement of the pads 212 and are present on the edge portion of one side of the semiconductor chip (the IC chip) 213 and are arranged near the center of the one side (refer to FIG. 3). This reason is that in the construction of the semiconductor devices which are manufactured using the lead frames, as shown in FIG. 3, since the lengths of the leads 200 to 209 become short as the leads are located closer to the center of the edge portion of the semiconductor chip, the shorter input/output leads of the LNA part are used to be intended the reduction of the parasitic inductance.

The offset PLL 309 is provided in the OPLL part; the variable gain amplifier 305 is provided in the PGA part; the divider 307 is provided in the DIV part; the modulator 308 is provided in the QMOD part; the demodulator 306 is provided in the DEMOD part; the synthesizer 310 is provided in the Dual Synth part; and the IFVCO 325 is provided in the VCO part.

Figure 4:
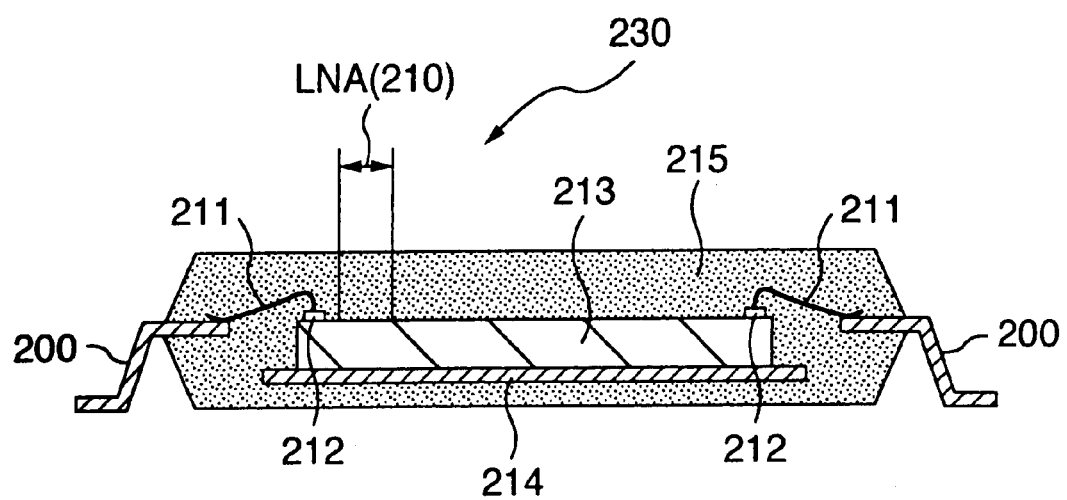
FIG. 4 is a schematic cross sectional view showing the construction of the semiconductor device shown in FIG. 3.

The IC chip 231 is incorporated in the desired package to become a semiconductor device. A semiconductor device 230 of the first embodiment, as shown in FIGS. 3 and 4, is of the QFP (Quadrature Flat Package) structure in which the leads 200 to 209 are projected from the peripheral faces (the sides) of flat quadrangle shaped package 215 made of insulating resin. The outer end parts of the leads 200 to 209 are bent only one step into the stepped like shape as shown in FIG. 4 to become the gull-wiring type which is suitable for the surface mounting.

A quadrangle chip fixing part 214 slightly larger than the IC chip 213 and smaller than the package 215 is located in the package 215. Then, the IC.chip 213 is bonded to the main surface of the chip fixing part 214 through bonding agent (not shown). In addition, the pads 212 which provided on the main surface of the IC chip 213 and the inner end parts of the leads 200 to 209 are connected to one another through conductive wires 211, respectively. Both of the IC chip 213 and the conductive wires 211 are perfectly encapsulated in the package 215.

Suspending leads 216 extends from the corner parts of the chip fixing part 214 toward the corner parts of the package 215 and also are cut at the outer peripheral parts of the package 215.

In manufacturing the semiconductor device 230, while not particularly illustrated, a lead frame is employed. This lead frame is obtained by patterning a metal plate having a predetermined thickness by the accurate press or the etching and has the pattern in which the chip fixing part (die pad) 214, the suspending leads 216 for supporting the chip fixing part 214, and the leads 200 to 209 are respectively included. In addition, the leads 200 to 209 are supported to the frame by fine tie-bars which are provided in an area out of the area in which the above-mentioned package 215 is formed. Also, the suspending leads 216 are supported to the tie-bars or the frame. Then, after having formed the package 215 by the resin encapsulation, the unnecessary parts of the lead frame such as the above-mentioned tie-bars are all cut to be removed therefrom and also the outer end parts of the leads 200 to 209 which are projected from the package 215 are formed into the gull-wiring type, thereby completing the manufacture of a semiconductor device 230.

As shown in FIGS. 3 and 4, the low-noise amplifier (LNA) 210 is provided along one edge portion of the IC chip 213 at the center of that side and uses, as I/O leads for the LNA, the short leads 201 to 209 having the small parasitic inductance.

Next, the layout of the LNA circuit will hereinbelow be described in detail with reference to the schematic view of FIG. 1, and FIGS. 6 and 7. In FIG. 1, there are shown: a LNA circuit 147 (i.e., the part which is surrounded by a dashed line) of the IC chip 213 which is fixed to the main surface of the chip fixing part 214 and is encapsulated with the package 215; the leads 201 to 209 and 144 which extend inside and outside the package 215; wires 211 through which the leads 201 to 209 and 144 and the pads 101 to 109 and 128 are connected to one another; matching circuits 134 to 137 connected to the respective leads 201 to 207; terminals 138 to 141 connected to the respective matching circuit 134 to 137; and a power source line 143 which is arranged outside the IC chip 213 and connected to the lead 209, and a ground line 142 arranged outside the IC chip 213.

The LNA circuit 147 has two LNAs, i.e., an LNA 110 for the low frequency band used in the GSAM system, and an LNA 111 for the high frequency band used in the DCS 1800 system. Both of the LNAs are constituted by the bipolar transistors. In addition, the electrostatic discharge protecting circuits 112 to 114 are connected to the electrodes of the LNA 110 for the low frequency band, respectively, and the electrostatic discharge protecting circuits 115 to 117 are connected to the electrodes of the LNA 111 for the high frequency band, so that the electrostatic discharge of the both of the LNA 110 for the low frequency band and the LNA 111 for the high frequency band is prevented.

The pads 101 to 109 of the LNA 110 for the low frequency band and the LNA 111 for the high frequency band are arranged along one edge portion of the IC chip 213, not to place any wirings between the one side and the pads 101 to 109, and are provided at the center part of an edge portion 119. This reason is that as described above, the leads 201 to 209 and 144, the inner ends of which are made face the center of the edge portion 119 of the IC chip 213 and to the center part of the edge portion 119 are both short with the distances between the inner ends and the outer ends, so that it is possible to reduce the parasitic inductance.

In addition, between the respective electrodes for the LNA 110 of the low frequency band and the LNA 111 of the high frequency band and the respective pads 101 to 109, there are no wirings traversing other wirings electrically connected between the respective electrodes and the pads 101 to 109, thereby, it is taken into consideration that the wirings through which the electrodes and the pads 101 to 109 are connected to one another become shorter as much as possible. This reason is that the parasitic resistance and the parasitic capacity of the wirings are reduced to enhance the gain and the noise characteristics.

The pads 101 to 109 relating to the LNA circuit 147, as shown in FIG. 1, are arranged in a series and in the order from the pads 101 to 109. The function of the pads 101 to 109 is as follows.

The pad 101 is the input pad of the LNA 110 for the low frequency band; the pad 102 is the ground pad of the LNA 110 for the low frequency band; the pad 103 is an input pad of the LNA 110 for the low frequency band; the pad 104 is a first ground pad of the LNA 111 for the high frequency band; the pad 105 is an input pad of the LNA 111 for the high frequency band; the pad 106 is a second ground pad of the LNA 111 for the high frequency band; the pad 107 is an input pad of the LNA 111 for the high frequency band; the pad 108 is a power source pad of the bias circuit 118 and the electrostatic discharge protecting circuits 112 to 117 of the LNA 111 for the high frequency band; and the pad 109 is a ground pad of the bias circuit 118 and the electrostatic discharge protecting circuits 112 to 117 of the LNA 111 for the high frequency band.

The leads for the ground pads 102, 104 and 106 of the LNA circuit 147 are separated from that of the ground pad 109 for the bias circuit 118 for the LNA and the electrostatic discharge protecting circuits 112 to 117, so that such structure is prevented from oscillation due to the parasitic inductance generated from the wires and the leads and the parasitic capacitance of the LNA bias circuit 118 and the electrostatic discharge protecting circuits 112 to 117.

The leads 201 to 209 corresponding to the above-mentioned pads 101 to 109, as shown in FIG. 1, are arranged along the edge portion 119 and in the order from the lead 201 to the lead 209. The function of the leads 201 to 209 is as follows.

The lead 201 is an output lead of the LNA 110 for the low frequency band; the lead 202 is a ground lead of the LNA 110 for the low frequency band; the lead 203 is an input lead of the LNA 110 for the low frequency band; the lead 204 is a first ground lead of the LNA 111 for the high frequency band; the lead 205 is an output lead of the LNA 111 for the high frequency band; the lead 206 is a second ground lead for the LNA 111 for the high frequency band; the lead 207 is an input lead of the LNA 111 for the high frequency band;

the lead 208 is a power source lead of the bias circuit 118 and the electrostatic discharge protecting circuits 112 to 117 of the LNA 111 for the high frequency band; and the lead 209 is a ground lead of the bias circuit 118 and the electrostatic discharge protecting circuits 112 to 117 of the LNA 111 for the high frequency band.

Then, the inner end parts of the leads 201 to 209 and the pads 101 to 109 corresponding thereto are electrically connected to one another through the conductive wires 211, respectively.

As shown in FIG. 1, the receiving circuit 132 and the transmitting circuit 133 are both arranged in the position which is nearer the center part of the IC chip 213 than the LNA circuit 147. In FIG. 1, there are shown pads 126 and 127 in part of the receiving circuit 132 other than the LNA circuit 147, and pads 128 in part of the transmitting circuit 133. The pads 126 and 127 in part of the receiving circuit 132 are respectively connected to the electrostatic discharge protecting circuits 129, 130 in each of which two diodes are connected in parallel with each other between the ground line 145 of the receiving circuit and the power source line 146 of the receiving circuit. That is, each of the pads 126 and 127 in part of the receiving circuit system 132 is connected between the associated two diodes which are connected in series with each other. Similarly, the pad 128 in part of the transmitting circuit 133 is connected to the electrostatic discharge protecting circuit 131 at a place between the ground line 122 and the power source line 121, of the transmitting circuit.

In FIG. 1, the ground line 148 of the receiving circuit and the power source line 146 of the receiving circuit are illustrated with the hatching.

In FIG. 1, a lead 144 is illustrated next to the lead 209 in such a way as to be arranged in parallel with the lead 209. That lead 144 is electrically connected to the pad 128 in part of the transmitting circuit 133 through the wire 211.

The output matching circuit 134 of the LNA 110 for the low frequency band is connected between the lead 201 and the terminal 138; the input matching circuit 135 of the LNA 110 for the low frequency band is connected between the lead 203 and the terminal 139; the output matching circuit 136 of the LNA 111 for the high frequency band is connected between the lead 205 and the terminal 140; and the input matching circuit 137 of the LNA 111 for the high frequency band is connected between the lead 207 and the terminal 141.

The output matching circuit 134 of the LNA 110 for the low frequency band outputs the high frequency signal through the terminal 138 and also supplies the power source voltage from the power source line 143 to the collector 12C of the LNA 110 for the low frequency band. The input matching circuit 135 of the LNA 110 for the low frequency band inputs the high frequency signal to the base 13C of the LNA 110 for the low frequency band.

The output matching circuit 136 of the LNA 111 for the high frequency band outputs the high frequency signal through the terminal 140 and also supplies the power source voltage from the power source line 143 to the collector 12C of the LNA 111 for the high frequency band. The input matching circuit 137 of the LNA 111 for the high frequency band inputs the high frequency signal to the base 13C of the LNA 111 for the high frequency band.

The leads 202, 204 and 206 are electrically connected to the emitters 14C of the LNA 110 for the low frequency band and the LNA 111 for the high frequency band and also are electrically connected to the ground in the outside of the IC chip.

The LNA 110 for the low frequency band (the transistor part) is arranged adjacent to the pads 101 to 103 in such a way as to be made the shortest the high frequency wirings 120a arranged between the base 13C of the LNA 110 for the low frequency band and the pad 103, and the high frequency wiring 120b arranged between the emitter 14C of the LNA 110 for the low frequency band and the pad 102. In also the case of the LNA 111 for the high frequency band, similarly, the LNA 111 for the high frequency band is arranged adjacent to the pads 106 and 107.

The electrostatic discharge protecting circuits 112 to 114 for protecting the LNA 110 for the low frequency band from the electrostatic discharge are respectively arranged in the vicinity of the LNA 110 for the low frequency band and also are respectively connected to the collector 12C, the base 13C and the emitter 14C. Likewise, the electrostatic discharge protecting circuits 115 to 117 for protecting the LNA 111 for the high frequency band from the electrostatic discharge are arranged in the vicinity of the LNA 111 for the high frequency band.

Also, the bias circuit 118 is arranged in the vicinity of the LNA 110 for the low frequency band and the LNA 111 for the high frequency band, and is respectively connected to the LNA 110 for the low frequency band and the LNA 111 for the high frequency band through signal lines 123a and 123b which are respectively illustrated by broken lines.

A bias resistor 124 of the LNA 110 for the low frequency band converts the bias current from the bias circuit 118 into a bias voltage to supply the bias voltage thus obtained to the LNA 110 for the low frequency band. A bias resistor 125 of the LNA 111 for the high frequency band converts the bias current from the bias circuit 118 into a bias voltage to apply the bias voltage thus obtained to the LNA 111 for the high frequency band.

The electrostatic discharge protecting circuits 112 to 117 and the bias circuit 118 are supplied with the electric power through the power source line 121 and the ground line 122 of the transmitting circuit. In the TDMA (Time Division Multiple Access), since the transmitting circuit 133 is not operated when the LNA 147 and receiving circuit 132 is being operated, any of the noises from the power source system are not contained therein. This electric power is supplied thereto from the outside of the IC chip 213 throuah the power source line in which the lead 208, the wire 211 and the power source pad 108 are electrically linked with one another, and the power source line in which the lead 209, the wire 211 and the ground pad 109 are electrically linked with each other. These power source lines are also connected to the transmitting circuit system 133.

Figure 6:
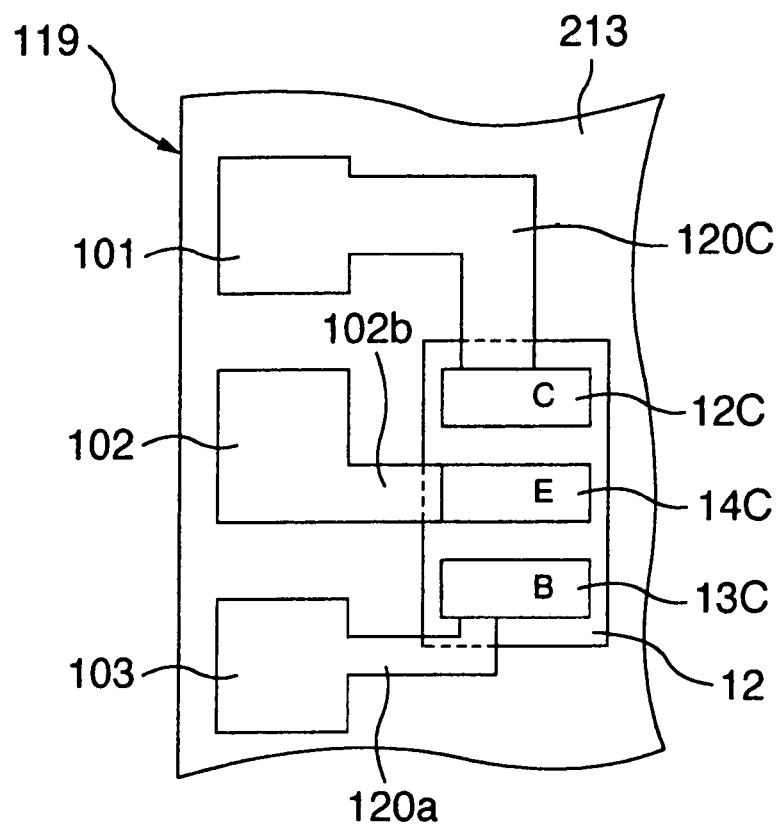
FIG. 6 is a schematic view showing the wiring pattern of a bipolar transistor constituting a low-noise amplifier in the IC chip shown in FIG. 5.
Figure 7:
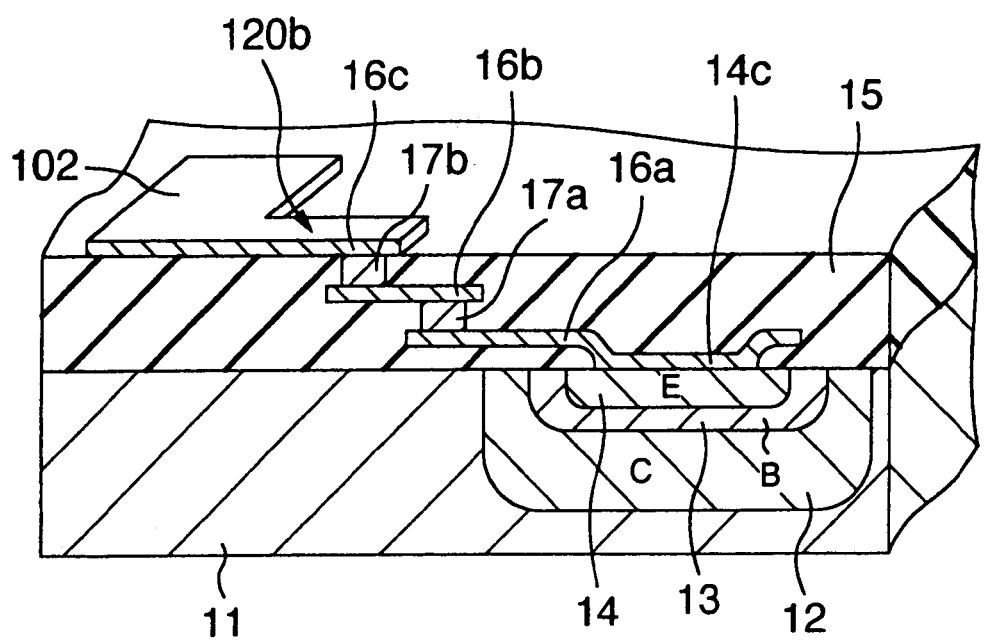
FIG. 7 is a schematic cross sectional view showing the wiring of the bipolar transistor shown in FIG. 6.

FIG. 6 is a schematic plan view showing the wiring pattern of the bipolar transistor constituting the LNA 110 for the low frequency band, and FIG. 7 is a schematic cross sectional view showing the wiring of the bipolar transistor.

As shown in FIG. 7, the bipolar transistor is constituted by the collector region 12, the base region 13 and the emitter region 14 which are formed in this order in a semiconductor layer 11 of a P-type or N-type, and the collector electrode 12c (the first electrode), the base electrode 13c (the control electrode) and the emitter electrode 14c (the second electrode) which are respectively connected to the collector region 12, the base region 13 and the emitter region 14 (refer to FIG. 6) FIG. 6 shows high frequency wirings 120a and 120b through which the electrodes and the pads are connected to one another.

In addition, FIG. 7 shows the wiring structure of the high frequency wiring 120b through which the emitter electrode 14c and the ground pad 102 of the LNA 110 for the low frequency band are connected to each other. A multilayer insulating film 15 is formed on the surface of the semiconductor layer 11. Then, conductive layers 16a, 16b and 16c of three layers, and contact plugs 17a and 17b each made of a conductor, through which the conductive layers are connected to one another are formed in and over the insulating film 15, and the emitter electrode 14c, the high frequency wiring 120b and the pad 102 are formed on the basis of those constituent elements.

The conductive layer 16a is the lowest layer and also a part thereof contacts the emitter region 14 to constitute the emitter electrode 14c. The conductive layer 16b is the intermediate layer, and is connected to the conductive layer 16a through the contact plug 17a as well as is connected to the conductive layer 16c as the most upper layer through the contact plug 17b. The conductive layer 16c is the most upper conductive layer which is formed on the surface of an insulating film 15 and an outer end part thereof is wide and forms the pad 112. Each of the above-mentioned conductive layers 16a, 16b and 16c, for example, is made of aluminum.

As shown in FIG. 6, the wiring arranged between the base electrode 13c and the pad 103, and the wiring arranged between the emitter electrode 14c and the pad 102 become short to form the high frequency wirings 120a and 120b, respectively.

In addition, the above-mentioned semiconductor layer 11 is constituted by a part or the like, which is electrically isolated, of an epitaxial layer which is formed on the main surface of the semiconductor substrate made of silicon constituting the IC chip 213.

In this connection, while not particularly illustrated, the wiring pattern of the LNA 111 for the high frequency band also becomes the pattern which approximates to that of the LNA 110 for the low frequency band, and thus the wiring pattern which becomes the shortest in terms of layout is adopted. In the case of the LNA 111 for the high frequency band, in order to reduce the parasitic inductance of the wire 211 and the leads 204, 206 to realize the high gain, the emitter is connected to the pads 212, 104 and 106, respectively.

Next, referring back to FIG. 1, the layout of the transmitting and receiving circuit which is arranged in the periphery of the LNA circuit 147 will hereinbelow be described simply. The power source line 146 of the receiving circuit 132 and the ground line 145 of the receiving circuit 132 are both connected to the outside of the IC chip 213 through a power source lead and a ground lead (both not shown) to supply the power source voltage to the receiving circuit 132. The pads 126 and 127 in part of the receiving circuit are connected to leads (not shown) through the wires, respectively, to carry out the input and output of the signals to and from the outside of the IC chip 213. The pad 128 in part of the transmitting circuit 133 is connected to the lead 144 through the wire 211 to carry out the input and output of the signals to and from the outside of the IC chip 213. Other circuits other than the LNA circuit are arranged in the order of the ground lines 122, 145, the electrostatic discharge protecting circuits 129 to 131, the power source lines 121, 146, the pads 126 to 128, the transmitting circuit 133, the receiving circuit 132 such as a synthesizer 310, IFVCO325 and devider 307 from the edge portion 119 of the IC chip 213 towards the center of the IC chip 213.

The receiving circuit 132 shown in FIG. 1 corresponds to the high frequency band receiving mixer 303a, the low frequency band receiving mixer 303b, the mixer 304 in the next stage, the variable gain amplifier 305 and the demodulator 306 which are all shown in FIG. 2, and also the transmitting circuit 133 shown in FIG. 1 corresponds to the modulator 308 and the offset PLL 309 shown in FIG. 2.

According to the first embodiment of the present invention, there are offered the following effects.

(1) Since any of wirings other than the wirings for the low-noise amplifier(s) are not arranged between the pads 101 to 109, and the collector electrode 12c, the base electrode 13c and the emitter electrode 14c of the transistor, the distances between the collector electrode 12c, the base electrode 13c and the emitter electrode 14c, and the pads 101 to 109 become short. As a result, the wiring capacitance is reduced, the gain is increased and the noise characteristic become excellent due to the reduction of the wiring resistance.

(2) Since no wiring is arranged between the edge portion 119 of the IC chip 213 and the pads 101 to 109 at all, the lengths of the wires through which the pads 101 to 109 and the inner ends of the leads 201 to 209 and 144 become short. As a result, the noise characteristic and gain become excellent due to the reduction of the parasitic inductance of the wires.

(3) The LNA 210 (designated with reference numerals 110 or 111 in FIG. 1), as shown in FIG. 3, is present on the side of the edge portion 119 of the semiconductor chip 213 and also is arranged near the center of that edge portion 119. In the package structure employing the leads 200 to 209, the lengths of the leads 200 to 209 which are arranged near the center of the above-mentioned edge portion 119 are all short. As a result, the distances from the pads 101 to 109 to the outer ends of the leads 200 to 209 which are projected to the outside of the package become short, and hence it is possible to increase the gain and to improve the noise characteristic.

(4) Since there is adopted the wiring structure in which the wirings extended from the pads 101 to 109, respectively, are coupled to the base electrode of the transistor, and one electrodes of the protection diodes 112 to 117 which are provided for the above-mentioned transistor, the layout design of the parts of the circuits becomes easy to be carried out.

(5) In the wireless communication system, since the low-noise amplifiers 110, 111 amplify the received signal having a very small magnitude by the circuit in the first stage of the receiving circuit to send the amplified signal to either the mixer 303a or 303b in the next stage, the low-noise amplifiers 110, 111 control greatly the characteristics of the whole receiving circuit. Therefore, according to the first embodiment, since the high gain and the low noise are obtained in the low-noise amplifier 147, it is possible to enhance the characteristics of the whole receiving circuit of the wireless communication system.

(6) From the item (5), since the gain and the noise characteristic of the low-noise amplifiers 110, 111 are excellent, the specification of the circuits after the mixer 303a or 393b in the next stage can be less severe and hence the circuit design becomes easy to be carried out.

Second Embodiment

Figure 8:
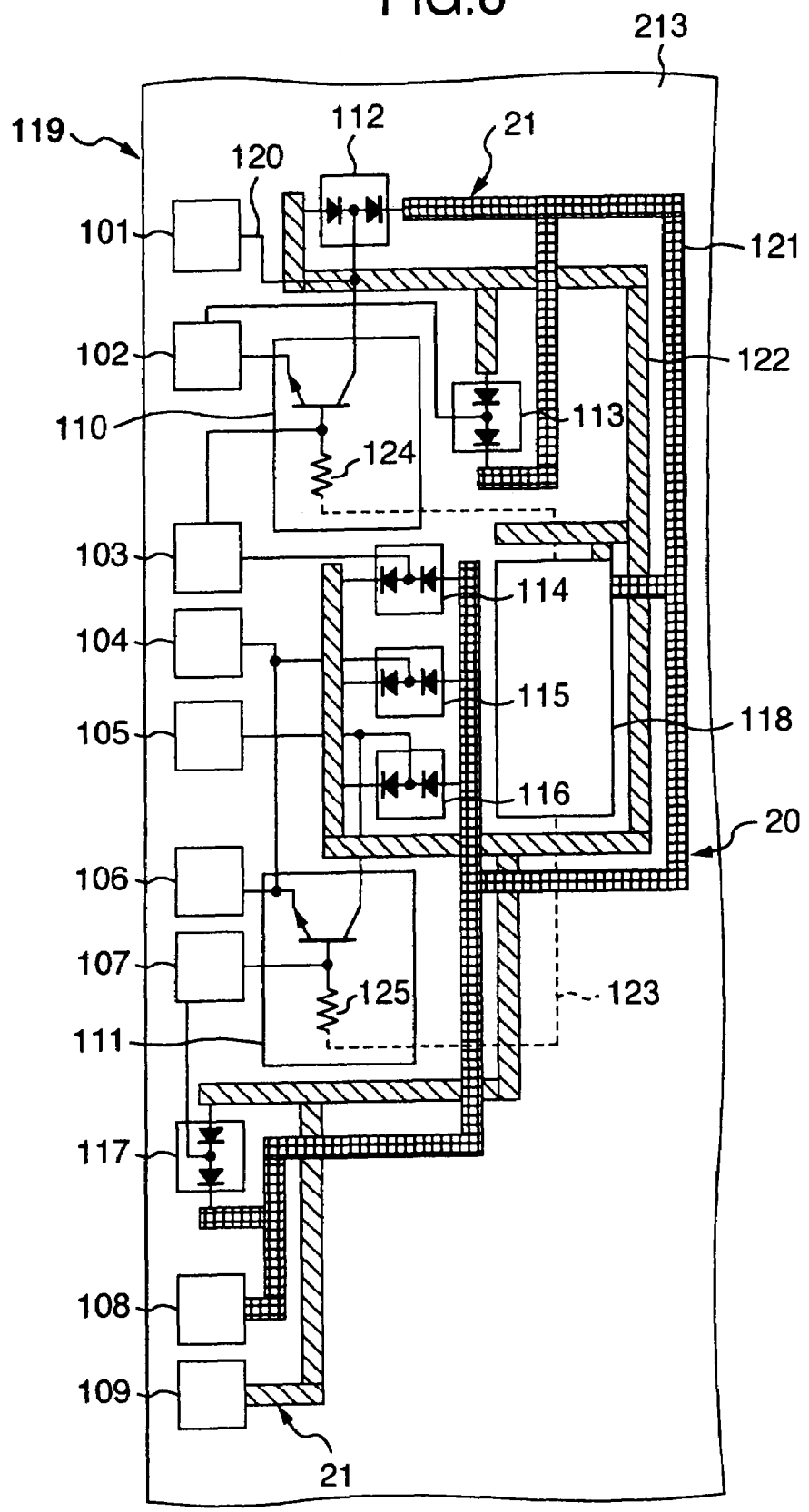
FIG. 8 is a schematic layout diagram, partly in circuit diagram, showing schematically a configuration of a part of a semiconductor integrated circuit device and the like, in which low-noise amplifiers are incorporated, in a wireless communication system of a dual band according to a second embodiment of the present invention.
Figure 9:
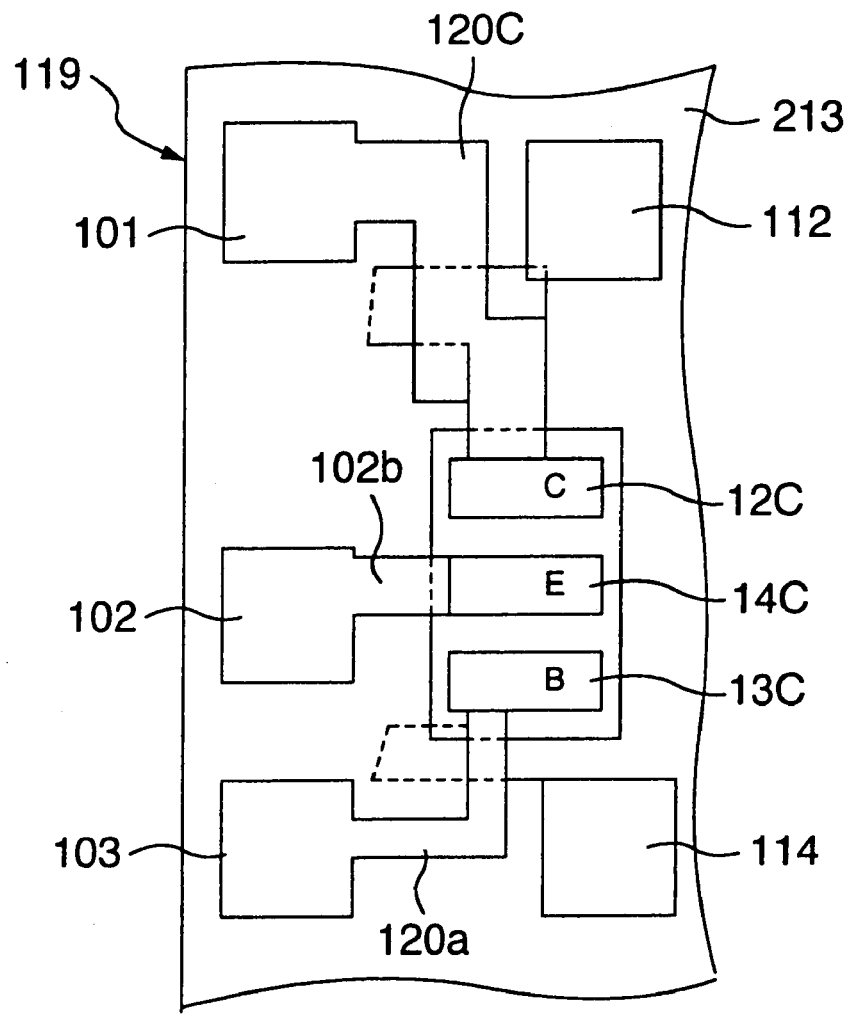
FIG. 9 is a schematic plan view showing the wiring pattern of a bipolar transistor constituting a low-noise amplifier in an IC chip which is incorporated in a wireless communication system according to the second embodiment of the present invention.

FIG. 8 is a schematic block diagram, partly in circuit diagram, showing a configuration in part of a semiconductor integrated circuit device, in which the low-noise amplifiers 110 and 111 are both incorporated in a dual band wireless communication system according to a second embodiment of the present invention, and FIG. 9 is a schematic plan view showing the wiring pattern of a bipolar transistor constituting the low-noise amplifier 110 in the IC chip 213 which is incorporated in the wireless communication system of the second embodiment.

While in the first embodiment shown in FIG. 1, the part in which the bias circuit 118 is provided between the LNA 110 for the low frequency band and the LNA 111 for the high frequency band has the layout in which the peripheral part of the LNA circuit 147 becomes hollow inwardly with respect to the flat surface, the area which becomes hollow inwardly with respect to the flat surface may not be effectively utilized in the layout design of the receiving circuit 132 and the transmitting circuit 133 in some cases. In other words, this hollow area becomes the unnecessary area.

Then, the second embodiment provides the arrangement of the LNA circuit 147 which makes easy the layout design utilizing effectively the area. That is, the LNA 110 for the low frequency band, the LNA 111 for the high frequency band and the electrostatic discharge protecting circuits 112 to 117 for these amplifiers 110 and 111 are arranged in one area having a contour which is surrounded with an edge portion 119 of the above-mentioned semiconductor chip (the IC chip) 213, an opposite side 20 which is opposite to that edge portion 119 and mutually-opposite sides 21 which link the edge portion 119 and the side 20 opposite thereto with each other. Then, the opposite side 20, in order to be linked with the mutually-opposite sides 21, has the contour in which the power source line 121 and the ground line 122 are changed step by step. Such a contour is provided, whereby the area of the layout can be effectively utilized.

In other words, the amplifiers 110 and 111 for the signal processing systems, and the electrostatic discharge protecting circuits 112 to 117 which are connected to these amplifiers, respectively, are provided in one area which is in turn formed between the edge portion 119 of the semiconductor chip, and the opposite side which is opposite to the edge portion 119. Thus, the side 20 of the area near the above-mentioned opposite side is formed in the form of the contour in which the side 20 is changed step by step through the power source line 121 and the ground line 122.

While if this layout is adopted, as shown in FIG. 9, the patterns of the power source line 121 and the ground line 122 of the transmitting circuit become complicated as compared with the patterns of these lines shown in FIG. 6, since each of the bent patterns of the power source line and the ground line on the side 20 of the LNA circuit 110 is not complicated as compared with FIG. 6, the layout of another circuit which is adjacent to the LNA 110 becomes easy to be made.

In this connection, in the case where the power source line 121 and the ground line 122 on the side of the opposite side 20 are changed step by step, the wiring patterns of the LNA 111 for the high frequency band and the LNA 110 for the low frequency band are forced to be changed, so that the wiring lengths of these patterns of these amplifiers 110 and 111 are both increased. In this case, it is desirable in terms of the realization of the high performance of the communication system that the increase in the wiring length for the LNA 111 for the high frequency band is made smaller than that for the LNA 110 for the low frequency band, and the burden of the increase in the wiring length is imposed on the LNA 110 for the low frequency band as much as possible.

Third Embodiment

Figure 10:
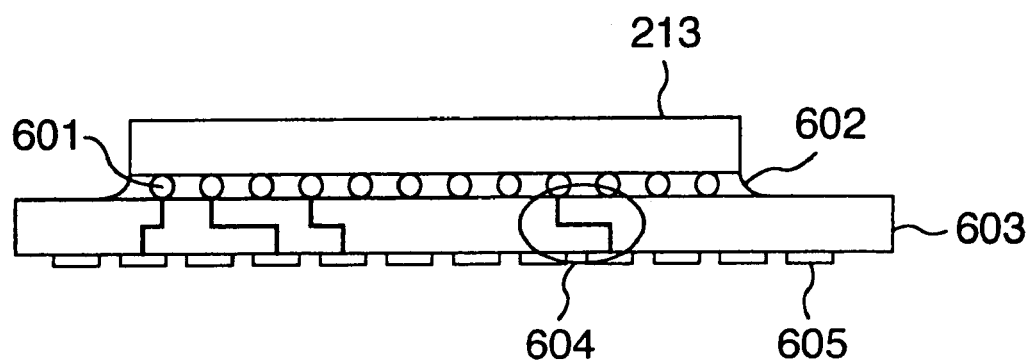
FIG. 10 is a schematic cross sectional view showing the construction of a CSP type semiconductor integrated circuit device which is incorporated in a wireless communication system according to a third embodiment of the present invention.
Figure 11:
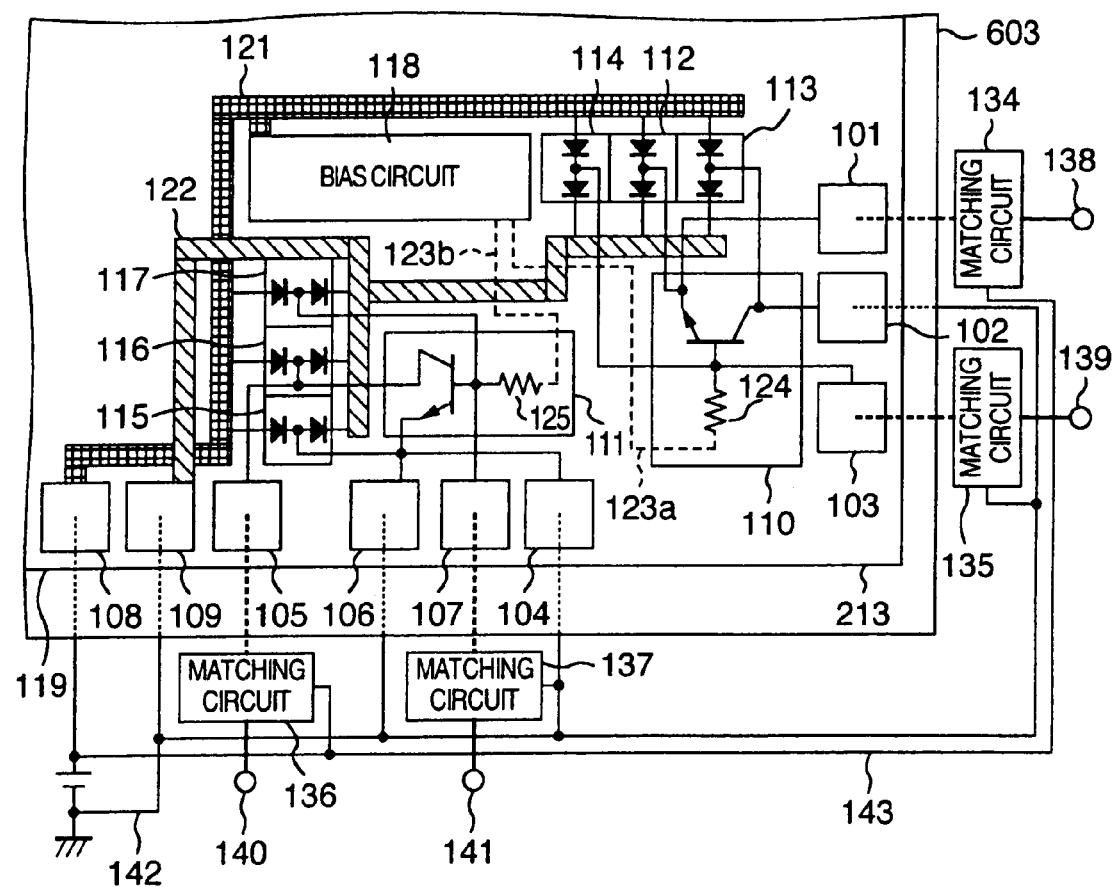
FIG. 11 is a block diagram, partly in circuit diagram, showing the layout of a multilayer ceramic substrate and the like which incorporates the semiconductor integrated circuit device using CSP shown in FIG. 10.

FIGS. 10 and 11 show a third embodiment of the present invention. FIG. 10 is a schematic cross sectional view showing the construction of a CSP (Chip Size Package) containing a semiconductor integrated circuit device, which is incorporated in the wireless communication system, and FIG. 11 is a block diagram, partly in circuit diagram, showing the layout of a multilayer ceramic substrate and the like in which the CSP containing the semiconductor integrated circuit device is incorporated.

The CSP has the construction in which solder bumps 601 are respectively provided on the pads (not shown) of the IC chip 213; these solder bumps 601 are respectively bonded to the pads (not shown) on the surface of a multilayer ceramic substrate 603 to be attached thereto; and a filler 602 is led into the space defined between the IC chip 213 and the multilayer ceramic substrate 603 to fix the IC chip 213 to the multilayer ceramic substrate 603. In addition, the rear face (the lower face in FIG. 10) of the multilayer ceramic substrate 603 is provided with the land planes 605. Then, the pads of the IC chip 213 and the land planes 605 of the rear face of the multilayer ceramic substrate 603 are connected to one another through via holes which are bored through the multilayer ceramic substrate 603 and the wirings 604 which are formed by leading a conductive material into these via holes.

The input and output of the signals and the supply of the electric power from the power source are carried out through these land planes 605. As apparent from the figure, since the CSP has no wire and lead as in the QFP and also the signals can be inputted and outputted roughly right under the pads, the parasitic inductance can be reduced, and hence the gain and the noise characteristics can be improved.

FIG. 11 shows an example of the layout of the LNAs 110 and 111 each employing the CSP. Since the package structure as shown in FIG. 10 is adopted, the lengths of the leads are not taken into consideration at all, and also in addition to the central part of the side of the IC chip 213, the LNA 110 for the low frequency band and the LNA 111 for the high frequency band may also be arranged in the corner of the IC chip 213. By arranging the LNAs 110 and 111 in the corner of the IC chip 213, the signal can be inputted and outputted to and from the LNA 110 for the low frequency band on the side of edge portion and also the signal can be inputted/outputted to and from the LNA 111 for the high frequency band on the side of other side intersecting perpendicularly that side.

FIG. 11 is a block diagram, partly in circuit diagram, showing the connection among the LNA 110 for the low frequency band and the LNA 111 for the high frequency band, the electrostatic discharge protecting circuits 112 to 114, and the electrostatic discharge protecting circuits 115 to 117 for the LNA 111 for the high frequency band all of which are shown in the form of the LNA circuit 147 of FIG. 1, and the CSP discrete components which are intended to be mounted from the outside. In this connection, the land planes are arranged right under the pads 101 to 109. Then, broken lines extending from the pads 101 to 109 exhibit the wirings which are distributed from the land planes to the positions under the CSP.

In this connection, the CSP may be applied to each of the IC chips 213 at all shown in FIGS. 1 and 8. In this case, since the wire 211 and the leads 200 to 209 become unnecessary, the parasitic inductance can be reduced.

Above, while the present invention made by the present inventors has been concretely described on the basis of the preferred embodiments, it is to be understood that the present invention is not intended to be limited to the above-mentioned preferred embodiments and hence the various changes and modifications will occur to those skilled in the art without departing from the subject matter of the invention. That is, while in the preferred embodiments, the bipolar transistors are employed as the transistors, other transistors, e.g., MOS FETs (Metal Oxide Semiconductor Field Effect Transistor) or HBTs (Hetero Junction Bipolar Transistor) may also be employed. In such a case, there are offered the same effects as those of the above-mentioned embodiments.

In addition, the present invention may be applied to the communication system of triple bands or the like, as well as a plurality of bands.

While in the above description, the case where the invention made by the present inventors is applied to the GSM/DCS 1800 oriented wireless communication system as the utilization field becoming the background of the invention, the present invention is not intended to be limited thereto. For example, the present invention can be similarly applied to the wireless communication systems each having an LNA of several GHz band such as WCDMA (Wideband Code Division Multiple Access) or cdmaOne. Since in these wireless communication systems, the wiring capacity, the wiring resistance and the parasitic inductance degrade the high frequency characteristics, the present invention is applied thereto, whereby the wiring capacity, the wiring resistance and the parasitic inductance can be reduced, and also the high frequency characteristics can be enhanced. In this connection, since in the CDMA, the transmitting and receiving operations are simultaneously carried out, it is required that the power source system for the LNA bias circuit and the electrostatic discharge protecting circuits needs to be specially provided.

What is claimed is:

1. A semiconductor device for use in a radio communication device, comprising:
   a semiconductor chip including a modulator, a demodulator and a differential low noise amplifier having a pair of radio signal inputs;
   a first electrode and a second electrode for the pair of radio signal inputs disposed on a main surface of the semiconductor chip;
   a chip mounting portion over which the semiconductor chip is mounted;
   a plurality of leads disposed around the chip mounting portion;
   a first conductive wire electrically connecting the first electrode and a first lead of the plurality of leads;
   a second conductive wire electrically connecting the second electrode and a second lead of the plurality of leads; and
   a resin sealing body covering the semiconductor chip, parts of the leads and part of the chip mounting portion,
   wherein each of the first and second leads has a first portion and a second portion;
   the second portion extends inwardly from the first portion toward the chip mounting portion;
   the second portion extends obliquely from the first portion in a plan view; and
   the first and second conductive wires are bonded to the second portions of the first and second leads, respectively.

2. The semiconductor device according to claim 1, wherein the first and second conductive wires are of substantially same length.

3. The semiconductor device according to claim 1, wherein the differential low noise amplifier processes a radio signal received by an antenna.

4. The semiconductor device according to claim 1, wherein the semiconductor device is electrically coupled with a base band circuit;
   an output signal from the demodulator is inputted into the base band circuit; and
   an output signal from the base band circuit is inputted into the modulator.

* * * * *